(12) United States Patent
Okaniwa et al.

(10) Patent No.: US 9,494,653 B2
(45) Date of Patent: Nov. 15, 2016

(54) BATTERY PACK MONITORING APPARATUS

(71) Applicants: Masakazu Okaniwa, Nagano (JP); Naoki Kitahara, Nagano (JP)

(72) Inventors: Masakazu Okaniwa, Nagano (JP); Naoki Kitahara, Nagano (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 696 days.

(21) Appl. No.: 13/773,200

(22) Filed: Feb. 21, 2013

(65) Prior Publication Data
US 2013/0214791 A1 Aug. 22, 2013

(30) Foreign Application Priority Data

Feb. 21, 2012 (JP) ................... 2012-034718

(51) Int. Cl.
*G01R 31/36* (2006.01)
(52) U.S. Cl.
CPC ......... *G01R 31/362* (2013.01); *G01R 31/3658* (2013.01)
(58) Field of Classification Search
CPC ................ G01R 31/3648; G01R 31/3658
USPC ........................................................ 324/434
See application file for complete search history.

(56) References Cited

U.S. PATENT DOCUMENTS

| 6,255,826 | B1* | 7/2001 | Ohsawa et al. ............... 324/426 |
| 8,163,411 | B2 | 4/2012 | Mizoguchi et al. |
| 2001/0035765 | A1* | 11/2001 | Maki ............................. 324/765 |
| 2008/0048617 | A1* | 2/2008 | Yoshida ......................... 320/132 |
| 2008/0103707 | A1* | 5/2008 | Iwasaki et al. ................. 702/58 |
| 2008/0143298 | A1* | 6/2008 | Yoshida ......................... 320/136 |
| 2009/0130542 | A1* | 5/2009 | Mizoguchi et al. ............ 429/61 |
| 2010/0244847 | A1* | 9/2010 | Kudo et al. .................... 324/433 |
| 2012/0179411 | A1* | 7/2012 | Sugimura ...................... 702/117 |

FOREIGN PATENT DOCUMENTS

| JP | 2005-168118 A | 6/2005 |
| JP | 2009-257923 A | 11/2009 |
| JP | 2010-011722 A | 1/2010 |

OTHER PUBLICATIONS

Patent Abstracts of Japan for Japanese Publication No. 2005-168118, publication date Jun. 23, 2005 (1 page).
Patent Abstracts of Japan for Japanese Publication No. 2009-257923, publication date Nov. 5, 2009 (1 page).

* cited by examiner

*Primary Examiner* — Drew A Dunn
*Assistant Examiner* — Jerry D Robbins
(74) *Attorney, Agent, or Firm* — Osha Liang LLP

(57) ABSTRACT

A battery pack monitoring apparatus detects line breakage of detection lines on a highest potential side and a lowest potential side of a battery pack. In the apparatus, a battery cell voltage detection section detects a voltage of each of battery cells through detection lines connected to both electrodes of the battery cells. A battery pack voltage detection section detects a voltage of the battery pack through the highest potential side detection line and the lowest potential side detection line of the battery pack. Diodes are connected in parallel to respective battery cells on the highest and lowest potential sides in a forward direction from a negative electrode toward a positive electrode. A control section determines that one of the lines is broken when a sum of the voltage of each of the battery cells detected and the voltage of the battery pack detected are not equal to each other.

4 Claims, 8 Drawing Sheets

FIG. 4A  NO LINE BREAKAGE
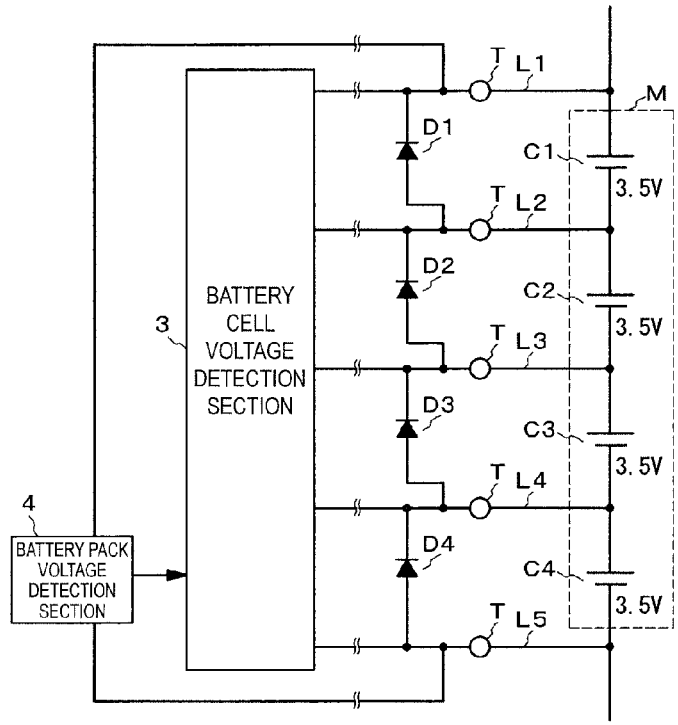
FIG. 4B  LINE BREAKAGE ON HIGHEST POTENTIAL SIDE
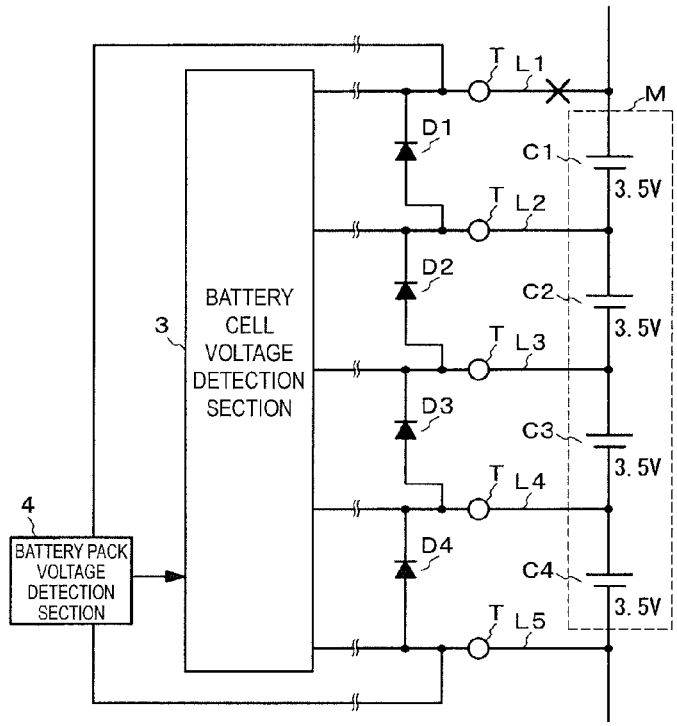

*FIG. 5A*  LINE BREAKAGE ON LOWEST POTENTIAL SIDE
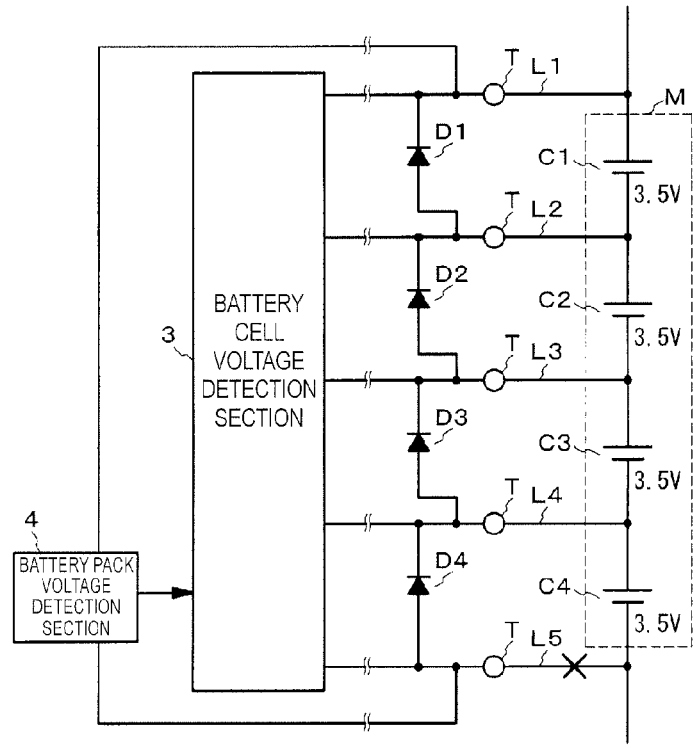
*FIG. 5B*  LINE BREAKAGE ON HIGHEST AND LOWEST POTENTIAL SIDES
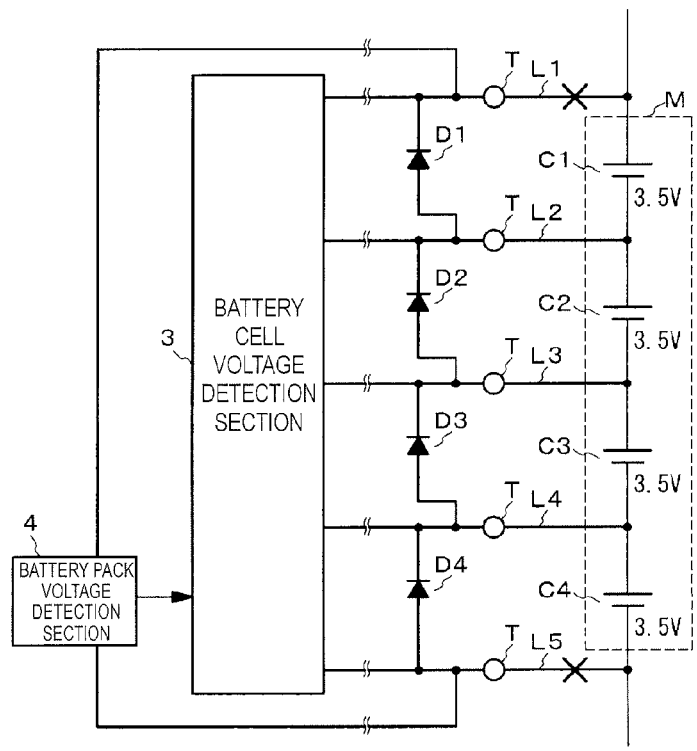

FIG. 6

| | MEASURED VALUE | | | | | CALCULATED VALUE | | |
|---|---|---|---|---|---|---|---|---|
| | BATTERY PACK M VOLTAGE Mv | BATTERY CELL C1 VOLTAGE C1v | BATTERY CELL C2 VOLTAGE C2v | BATTERY CELL C3 VOLTAGE C3v | BATTERY CELL C4 VOLTAGE C4v | SUM Csv OF EACH BATTERY CELL VOLTAGE | DIFFERENCE ΔV (SUM Csv − BATTERY PACK VOLTAGE Mv) | DETERMINATION |
| (a) NO LINE BREAKAGE | 14 V | 3.5 V | 3.5 V | 3.5 V | 3.5 V | 14 V | 0 V | NORMAL |
| (b) LINE BREAKAGE ON HIGHEST POTENTIAL SIDE | 9.8 V | 0 V | 3.5 V | 3.5 V | 3.5 V | 10.5 V | 0.7 V | HIGHEST POTENTIAL SIDE LINE BREAKAGE |
| (c) LINE BREAKAGE ON LOWEST POTENTIAL SIDE | 9.8 V | 3.5 V | 3.5 V | 3.5 V | 0 V | 10.5 V | 0.7 V | LOWEST POTENTIAL SIDE LINE BREAKAGE |
| (d) LINES BREAKAGE ON HIGHEST AND LOWEST POTENTIAL SIDES | 5.6 V | 0 V | 3.5 V | 3.5 V | 0 V | 7 V | 1.4 V | HIGHEST AND LOWEST POTENTIAL SIDE LINES BREAKAGE |

BATTERY PACK MONITORING APPARATUS

CROSS-REFERENCE TO RELATED APPLICATIONS

The present application claims priority from Japanese Patent Application No. 2012-034718, filed Feb. 21, 2012. The content of the priority application is hereby incorporated by reference in its entirety.

BACKGROUND OF THE INVENTION

1. Field of the Invention

One or more embodiments of the present invention relates to a battery pack monitoring apparatus that detects, in a battery pack which is constituted of a plurality of battery cells connected in series, line breakage of detection lines connected to both electrodes of each of the battery cells in order to detect a voltage of each of the battery cells.

2. Background Art

For example, as shown in Japanese Unexamined Patent Publication Nos. 2005-168118, 2009-257923, and 2010-11722, a battery pack is constituted of a plurality of battery cells connected in series. Detection lines are connected to positive and negative electrodes of each of the battery cells. These detection lines are connected to respective abnormality detectors of a battery pack monitoring apparatus (an abnormality detection apparatus for battery pack) through respective connectors. The abnormality detectors detect voltages of the battery cells through the detection lines, and determine charge/discharge abnormality in the battery cells based on the detected voltage values.

In Japanese Unexamined Patent Publication No. 2005-168118, transistors provided corresponding to respective battery cells are forced to be alternately turned on and off by outputting line breakage diagnosis conducting signals and an overcharge/overdischarge detection switching signal from an overcharge/overdischarge control circuit. Further, transistors to be turned on and transistors to be turned off are switched so as to be alternately turned on and off. Then, line breakage of a detection line connected between adjacent battery cells is detected based on a level of a signal (H or L) output from an abnormality detection circuit.

In Japanese Unexamined Patent Publication No. 2009-257923, zener diodes each having a reaction voltage equal to or higher than an overcharge determination voltage as well as equal to or lower than twice the overcharge determination voltage are connected to respective battery cells in parallel. Further, line breakage of a detection line connected between adjacent battery cells is detected based on detection states of overcharge abnormality and overdischarge abnormality of the adjacent battery cells.

In Japanese Unexamined Patent Publication No. 2010-11722, a polarity inversion detecting circuit is connected to first, second, and third detection lines from a highest potential side of a battery pack. Further, another polarity inversion detecting circuits is connected to first, second, and third detection lines from a lowest potential side of the battery pack. Further, line breakage of each of the first detection line from the highest potential side and the first detection line from the lowest potential side is detected based on a level of a signal (H or L) output from each of the polarity inversion detecting circuits according to each of voltage polarity inversion states between the first detection line from the highest potential side and a detection line adjacent thereto and between the first detection line from the lowest potential side and a detection line adjacent thereto. Further, diodes are connected to the respective battery cells in parallel in order to protect components inside the apparatus from electrostatic generated in connectors.

As described above, in the apparatuses of Japanese Unexamined Patent Publication Nos. 2005-168118 and 2009-257923, although line breakage of a detection line that is connected between adjacent battery cells is detected, it is not possible to detect line breakage of a highest potential side detection line and a lowest potential side detection line which are connected to respective ends of the battery pack. In the apparatus of Japanese Unexamined Patent Publication No. 2010-11722, because line breakage of each of the highest potential side detection line and the lowest potential side detection line is detected based on a level of a signal output from each of the polarity inversion detecting circuits, it is necessary to provide the polarity inversion detecting circuit at each of the highest potential side and the lowest potential side.

SUMMARY OF INVENTION

One or more embodiments of the present invention may provide a battery pack monitoring apparatus that can easily detect line breakage of detection lines on the highest potential side and the lowest potential side of a battery pack in a method different from the conventional technique.

In accordance with one aspect of the present invention, a battery pack monitoring apparatus includes a battery cell voltage detection section for detecting a voltage of each of serially connected battery cells constituting a battery pack through detection lines connected to both electrodes of each of the battery cells, a battery pack voltage detection section for detecting a voltage of the battery pack through the detection line on a highest potential side of the battery pack and the detection line on a lowest potential side of the battery pack, diodes each being connected in parallel to the battery cell on the highest potential side of the battery pack and the battery cell on the lowest potential side of the battery pack in a forward direction from a negative electrode toward a positive electrode of each of the battery cells, and a line breakage determining section for determining that one of the detection line on the highest potential side and the detection line on the lowest potential side is broken when a sum of the voltage of each of the battery cells detected by the battery cell voltage detection section and the voltage of the battery pack detected by the battery pack voltage detection section are not equal to each other.

According to the above configuration, when the highest potential side detection line or the lowest potential side detection line is broken, the voltage of the highest potential side battery cell connected to the highest potential side detection line or the voltage of the lowest potential side battery cell connected to the lowest potential side detection line is detected as 0 V by the battery cell voltage detection section. Further, the voltage of the battery pack is detected by the battery pack voltage detection section through one of the highest potential side detection line and the lowest potential side detection line, which is not broken, a detection line which is adjacent to the broken detection line, and a diode which is positioned near a line breakage point. That is, a value obtained by subtracting the voltage drop value of the diode positioned near the line breakage point from the sum of the voltages of the serially connected battery cells other than the highest potential side battery cell or the lowest potential side battery cell which is connected to the broken one of the highest potential side detection line and the lowest potential side detection line is detected as the voltage of the battery pack.

Therefore, the sum of the voltage of each of the battery cells detected by the battery cell voltage detection section and the voltage of the battery pack detected by the battery pack voltage detection section are not equal to each other. Accordingly, it is determined by the line breakage determining section that one of the highest potential side detection line and the lowest potential side detection line is broken. Therefore, it is possible to easily detect line breakage of the detection lines on the highest potential side and the lowest potential side of the battery pack by the use of the voltage drop in a forward direction of the diodes.

Further, in the battery pack monitoring apparatus according to one or more embodiments of the present invention, the line breakage determining section may determine that the detection line on the highest potential side is broken when a voltage of the battery cell on the highest potential side is 0 V, and the detection line on the lowest potential side is broken when a voltage of the battery cell on the lowest potential side is 0 V.

Further, in the battery pack monitoring apparatus according to one or more embodiments of the present invention, the line breakage determining section may determine that one of the detection line on the highest potential side and the detection line on the lowest potential side is broken when a difference between the sum of the voltage of each of the battery cells and the voltage of the battery pack is equal to a voltage drop value in a forward direction of each of the diodes, and both of the detection line on the highest potential side and the detection line on the lowest potential side are broken when the difference between the sum of the voltage of each of the battery cells and the voltage of the battery pack is equal to twice the voltage drop value in the forward direction of each of the diodes.

According to one or more embodiments of the present invention, it is possible to provide a battery pack monitoring apparatus that can easily detect line breakage of detection lines on the highest potential side and the lowest potential side of a battery pack.

BRIEF DESCRIPTION OF THE DRAWINGS

FIG. 4A and FIG. 4B are diagrams each illustrating a line non-breakage state and a line breakage state of the battery pack of FIG. 1 according to one or more embodiments of the present invention;

FIG. 5A and FIG. 5B are diagrams each illustrating a line breakage state of the battery pack of FIG. 1 according to one or more embodiments of the present invention;

FIG. 6 is a table illustrating a relationship among a voltage of each of the battery cells, a voltage of the battery pack, and a line breakage state of FIG. 1 according to one or more embodiments of the present invention;

DETAILED DESCRIPTION

Figure 1:
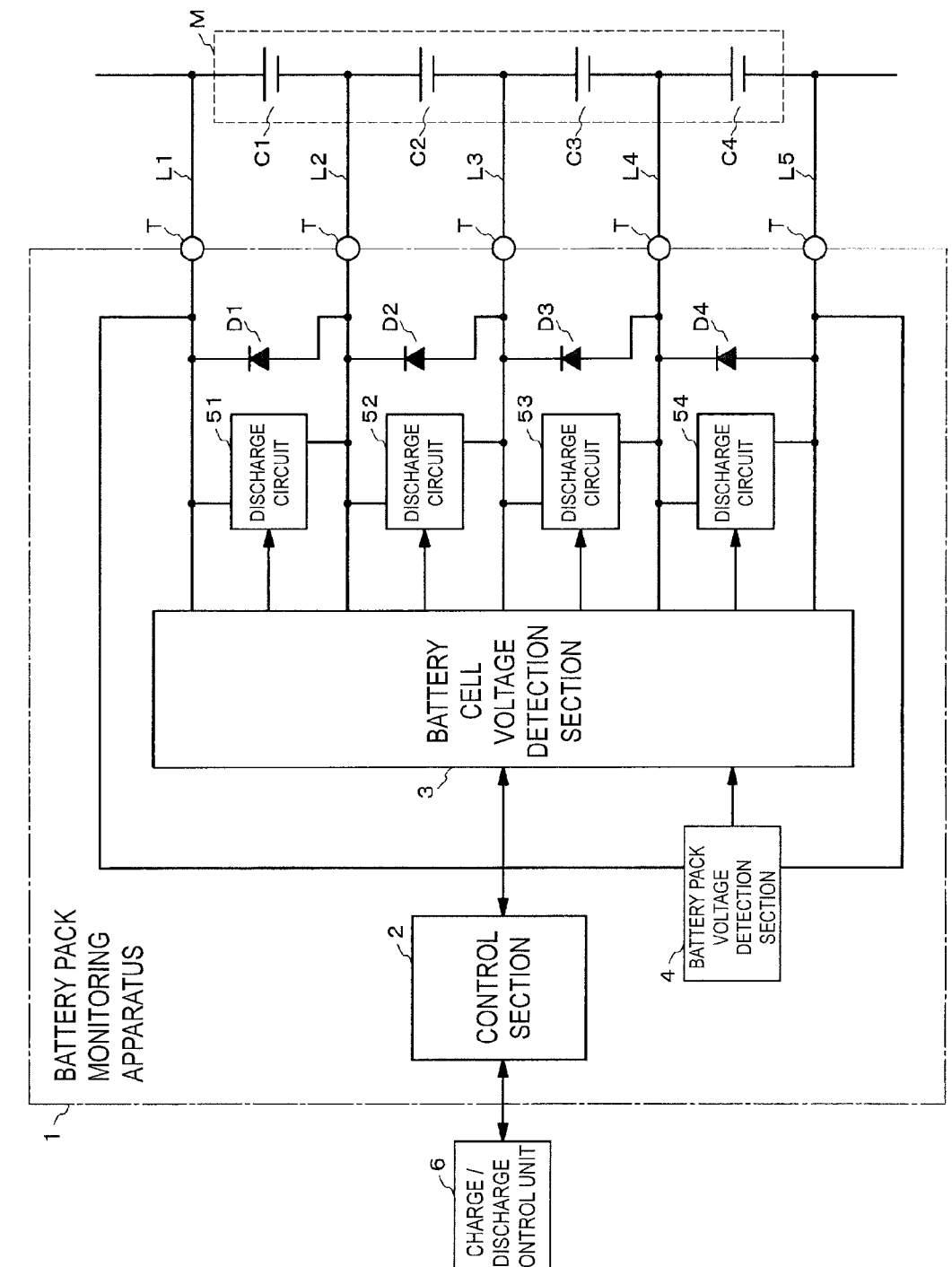
FIG. 1 is a configuration diagram of a battery pack monitoring apparatus according to one or more embodiments of the present invention.

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. Hereinafter, embodiments of the present invention will be described with reference to the drawings. In the figures, the same or corresponding components are denoted by the same reference numerals.

First, the configuration of a battery pack monitoring apparatus 1 according to one or more embodiments of the present invention will be described with reference to FIGS. 1 to 3.

The battery pack monitoring apparatus 1 shown in FIG. 1 configures, together with a charge/discharge control unit 6, a system for controlling charge and discharge of a battery pack M mounted on an electric vehicle. The battery pack M is constituted of a plurality of serially connected battery cells C1 to C4 each of which is a secondary battery. Each of the battery cells C1 to C4 is a lithium ion battery, for example.

The battery pack monitoring apparatus 1 includes a control section 2, a battery cell voltage detection section 3, a battery pack voltage detection section 4, discharge circuits 51 to 54, diodes D1 to D4, and connection terminals T.

The control section 2 is configured by a CPU, a memory, and the like. The control section 2 intercommunicates with each of the battery cell voltage detection section 3 and the charge/discharge control unit 6. Further, the control section 2 receives information output from the battery pack voltage detection section 4 through the battery cell voltage detection section 3.

The battery cell voltage detection section 3 is connected to each of the battery cells C1 to C4 through detection lines L1 to L5, which are connected to both electrodes (positive electrode and negative electrode) of the battery cells C1 to C4, the connection terminals T, and internal wiring of the battery pack monitoring apparatus 1.

Figure 2:
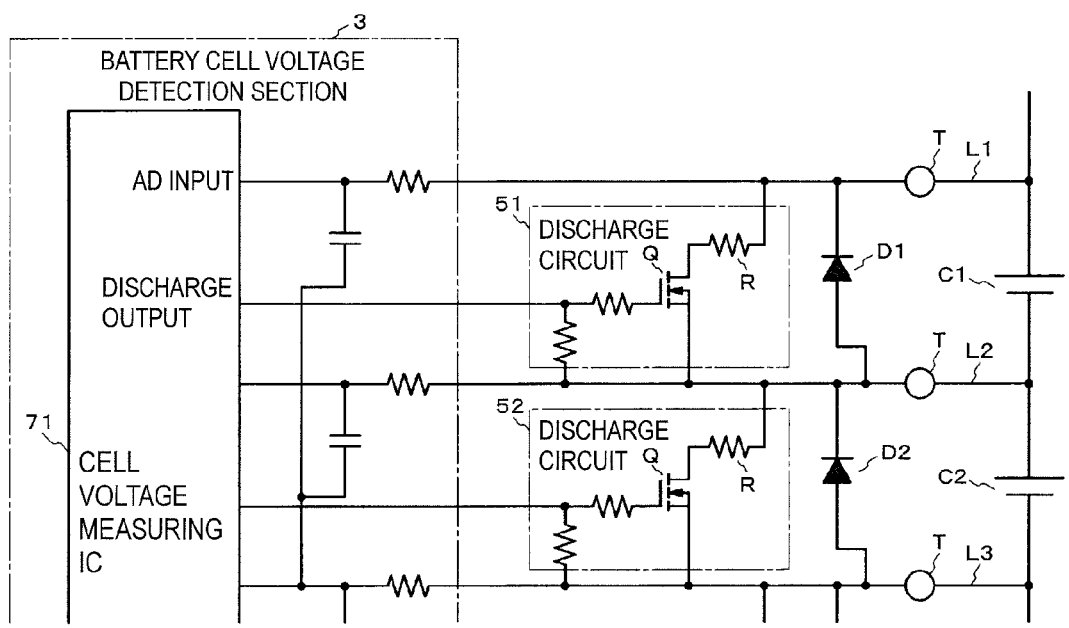
FIG. 2 is a detailed view of a battery cell voltage detection section and discharge circuits of FIG. 1 according to one or more embodiments of the present invention.

As shown in FIG. 2, the battery cell voltage detection section 3 is configured by a cell voltage measuring IC 71 and a circuit including resistors and capacitors. In FIG. 2, only a part of the battery pack monitoring apparatus 1 from the battery cells C1 and C2 to the battery cell voltage detection section 3 is shown. The other part from the battery cells C3 and C4 to the battery cell voltage detection section 3 has the same configuration as the configuration shown in FIG. 2.

The voltage measuring IC 71 measures a voltage of each of the battery cells C1 to C4 through the detection lines L1 to L5, which are connected to both electrodes of the battery cells C1 to C4 and the connection terminals T. Further, the cell voltage measuring IC 71 converts the measured voltage of each of the battery cells C1 to C4 into a digital value, and then sends the digital value to the control section 2. Further, the cell voltage measuring IC 71 outputs a discharge control signal for activating each of the discharge circuits 51 to 54 to each of the discharge circuits 51 to 54 based on an instruction from the control section 2.

As shown in FIG. 1, the discharge circuits 51 to 54 are provided for the battery cells C1 to C4, respectively. More specifically, the discharge circuits 51 to 54 are respectively connected to the battery cells C1 to C4 in parallel. Further, as shown in FIG. 2, each of the discharge circuits 51 to 54 includes a switching element Q and a discharge resistance R. For example, the switching element Q is constituted by a field effect transistor (FET). Although only the discharge circuits 51 and 52 are shown in FIG. 2, the configuration of each of the discharge circuits 53 and 54 is the same as the configuration of each of the discharge circuits 51 and 52.

In each of the discharge circuits 51 to 54, a drain of the switching element Q is connected to one end of the discharge resistance R. The other end of the discharge resistance R is connected to the positive electrode of each of the battery cells C1 to C4 through each of the connection terminals T and each of the detection lines L1 to L4. A source of the switching element Q is connected to the negative electrode of each of the battery cells C1 to C4 through each of the connection terminals T and each of the detection lines L2 to L5. Accordingly, there are formed discharge circuits each of which is connected from the positive electrode of each of the battery cells C1 to C4 to the negative electrode of each of the battery cells C1 to C4 through the discharge resistance R and the switching element Q.

When a discharge control signal is applied to a gate of the switching element Q of each of the discharge circuits 51 to 54 from the cell voltage measuring IC 71 of the battery cell voltage detection section 3, the switching element Q is turned ON, so that each of the battery cells C1 to C4 is discharged. Further, each of the battery cells C1 to C4 is charged by a charging unit (not shown) at a constant voltage.

As shown in FIG. 1, diodes D1 to D4 are provided between the battery cells C1 to C4 and the discharge circuits 51 to 54, respectively. The diodes D1 and D4 are respectively connected in parallel to the battery cell C1 on a highest potential side of the battery pack M and the battery cell C4 on a lowest potential side thereof in a forward direction from the negative electrode of each of the battery cells C1 and C4 toward the positive electrode thereof. The diodes D2 and D3 are respectively connected in parallel to the battery cells C2 and C3 both of which are positioned in a middle part of the battery pack M in a forward direction from the negative electrode of each of the battery cells C2 and C3 toward the positive electrode thereof.

Figure 3:
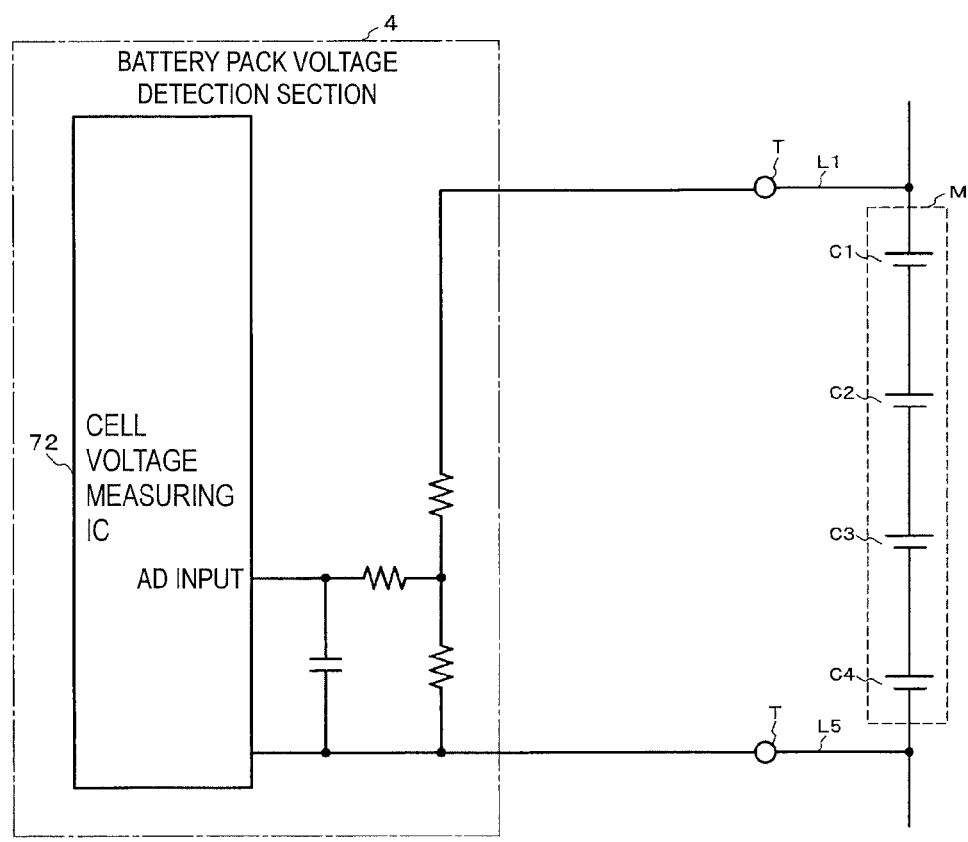
FIG. 3 is a detailed view of a battery pack voltage detection section of FIG. 1 according to one or more embodiments of the present invention.

As shown in FIG. 3, the battery pack voltage detection section 4 is configured by a cell voltage measuring IC 72 and a circuit including resistances and a capacitor. The cell voltage measuring IC 72 measures a voltage of the battery pack M through the detection lines L1 and L5 on the highest potential side and the lowest potential side of the battery pack M, and the corresponding connection terminals T. Further, the cell voltage measuring IC 72 converts the measured voltage of the battery pack M into a digital value, and then sends the digital value to the control section 2 through the cell voltage measuring IC 71 of the battery cell voltage detection section 3. In FIG. 3, a part of the circuit between the detection line L1 and the detection line L5 is not shown.

The control section 2 determines line breakage of the highest potential side detection line L1 or the lowest potential side detection line L5 of the battery pack M based on the voltages of the battery cells C1 to C4 detected by the battery cell voltage detection section 3 and the voltage of the battery pack M detected by the battery pack voltage detection section 4. The control section 2 is an example of a "line breakage determining section" of one or more embodiments of the present invention.

Information obtained in the battery pack monitoring apparatus 1 such as the voltages of the battery cells C1 to C4, the voltage of the battery pack M, and the breakage state of each of the detection lines L1 and L5 is sent from the control section 2 to the charge/discharge control unit 6. The charge/discharge control unit 6 determines necessity of charge or discharge of each of the battery cells C1 to C4 and the battery pack M based on the information regarding the voltages of the battery cells C1 to C4 and the voltage of the battery pack M. Then, according to the result of determination, the charge/discharge control unit 6 provides the battery pack monitoring apparatus 1 and a charge unit (not shown) with an instruction of charge or discharge.

Next, a line breakage detection process performed by the battery pack monitoring apparatus 1 will be described with reference to FIGS. 4A to 7. The line breakage detection process is a process for detecting line breakage of the detection lines L1 and L5, which are connected to respective ends of the battery pack M. A line breakage detection of the detection lines L2, L3, and L4, which are connected to the middle part of the battery pack M, is carried out by another detection process such as a process by known technique.

Figure 7:
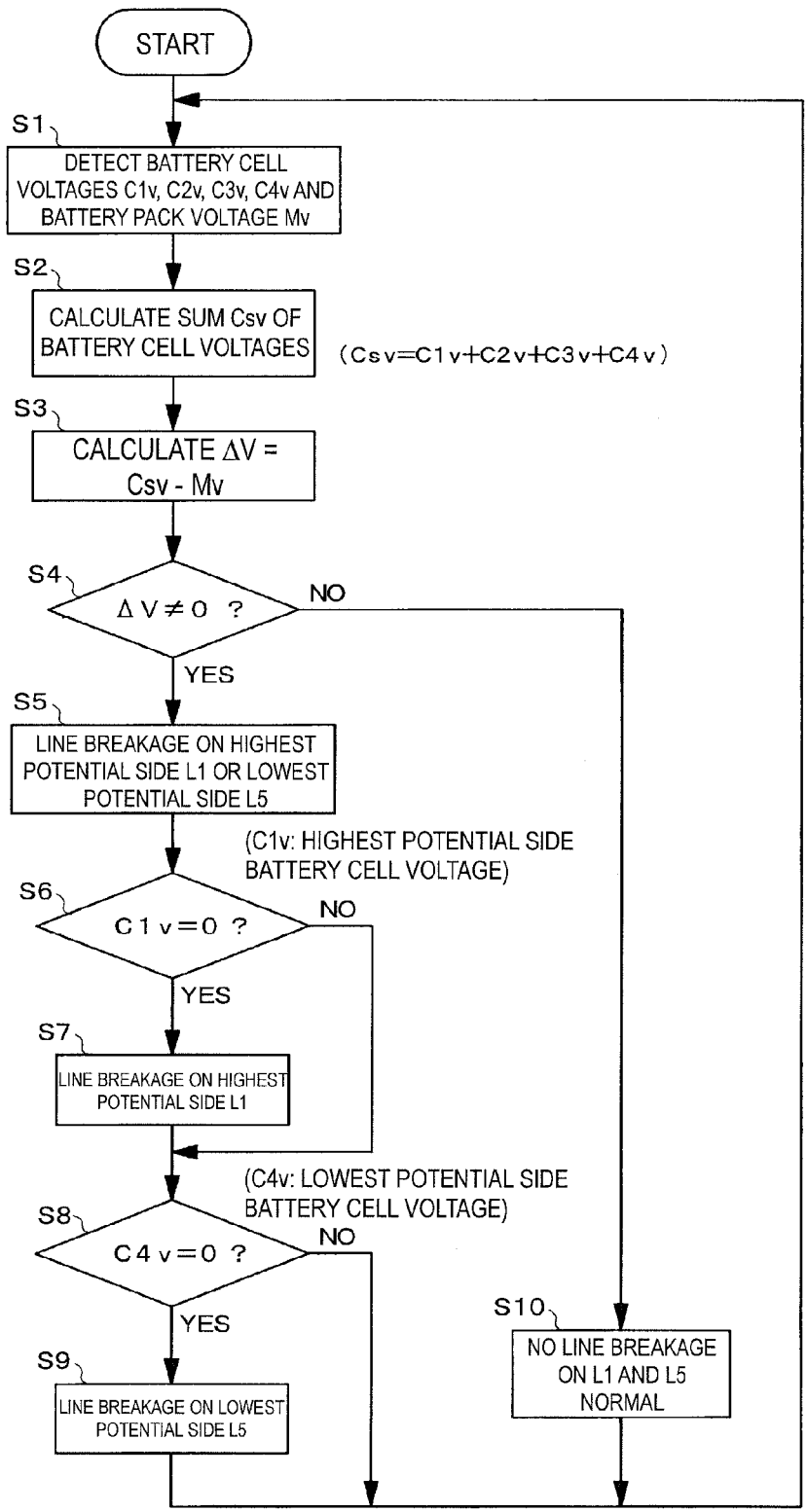
FIG. 7 is a flow chart illustrating a line breakage detection process of the battery pack monitoring apparatus of FIG. 1 according to one or more embodiments of the present invention.

As shown in FIG. 7, firstly, voltages C1$v$, C2$v$, C3$v$, and C4$v$ of the battery cells C1, C2, C3, and C4 are detected by the battery cell voltage detection section 3 of the battery pack monitoring apparatus 1, and a voltage Mv of the battery pack M is detected by the battery pack voltage detection section 4 of the battery pack monitoring apparatus 1 (step S1). Next, the control section 2 calculates a sum Csv (=C1$v$+C2$v$+C3$v$+C4$v$) of the voltages C1$v$, C2$v$, C3$v$, and C4$v$ of the battery cells C1, C2, C3, and C4 (step S2).

Further, the control section 2 calculates a difference ΔV (=Csv−Mv) between the sum Csv of the voltages C1$v$, C2$v$, C3$v$, and C4$v$ of the battery cells C1, C2, C3, and C4 and the voltage Mv of the battery pack M (step S3). Then, it is confirmed as to whether or not the difference ΔV is 0 (step S4).

At this time, for example, as shown in FIG. 4A and row (a) of FIG. 6, when there is no line breakage in the battery pack M and the voltage of each of the battery cells C1, C2, C3, and C4 is 3.5 V, all of the voltages C1$v$, C2$v$, C3$v$, and C4$v$ of the battery cells C1, C2, C3, and C4 are detected as 3.5 V by the battery cell voltage detection section 3 through the detection lines L1 to L5. Further, the voltage Mv of the battery pack M is detected as 14 V by the battery pack voltage detection section 4 through the detection lines L1 and L5.

Then, the sum Csv of the voltages C1$v$, C2$v$, C3$v$, and C4$v$ of the battery cells C1, C2, C3, and C4 is calculated to be 14 V by the control section 2. Further, because both of the sum Csv and the voltage Mv of the battery pack M are 14 V and therefore equal to each other, the difference ΔV between the sum Csv and the voltage Mv is calculated to be 0 V by the control section 2.

Therefore, in step S4 in FIG. 7, the control section 2 confirms that the difference ΔV is 0 (step S4: NO). That is, the control section 2 confirms that the sum Csv of the voltages C1$v$, C2$v$, C3$v$, and C4$v$ of the battery cells C1, C2, C3, and C4 and the voltage Mv of the battery pack M are equal to each other. Accordingly, the control section 2 determines that the highest potential side detection line L1 and the lowest potential side detection line L5 of the battery pack M are not broken and therefore in a normal state (step S10).

On the other hand, for example, as shown in FIG. 4B and row (b) of FIG. 6, when the highest potential side detection line L1 of the battery pack M is broken and the voltage of each of the battery cells C1, C2, C3, and C4 is 3.5 V, the voltage C1v of the highest potential side battery cell C1 is detected as 0 V by the battery cell voltage detection section 3. All of the voltages C2v, C3v, and C4v of the other battery cells C2, C3, and C4 are detected as 3.5 V by the battery cell voltage detection section 3 through the detection lines L2 to L5.

Further, the sum Csv of the voltages C1v, C2v, C3v, and C4v of the battery cells C1, C2, C3, and C4 is calculated to be 10.5 V by the control section 2. The voltage Mv of the battery pack M is detected by the battery pack voltage detection section 4 through the lowest potential side detection line L5 which is not broken, the detection line L2 which is adjacent to the broken detection line L1, and the diode D1 which is positioned near a line breakage point. At this time, when a voltage drop value in the forward direction (hereinafter, simply referred to as a "voltage drop value") of the diode D1 is 0.7 V, the voltage Mv is calculated as follows: 10.5 V−0.7 V=9.8 V. Further, the difference ΔV between the sum Csv (=10.5 V) and the voltage Mv (=9.8 V) of the battery pack M is calculated to be 0.7 V by the control section 2.

The difference ΔV of 0.7 V corresponds to the voltage drop value of the diode D1. Further, in one or more embodiments of the present invention, the voltage drop value of each of the diodes D2, D3, and D4 is also 0.7 V.

When the difference ΔV between the sum Csv of the voltages C1v, C2v, C3v, and C4v of the battery cells C1, C2, C3, and C4 and the voltage Mv of the battery pack M is calculated to be 0.7 V as described above, the control section 2 confirms that the difference ΔV is not 0 in step S4 of FIG. 7 (step S4: YES). That is, the control section 2 confirms that the sum Csv of the voltages C1v, C2v, C3v, and C4v of the battery cells C1, C2, C3, and C4 and the voltage Mv of the battery pack M are not equal to each other. Accordingly, the control section 2 determines that one of the highest potential side detection line L1 and the lowest potential side detection line L5 is broken (step S5).

Subsequently, the control section 2 confirms that the voltage C1v of the highest potential side battery cell C1 is 0 (step S6: YES), and thereby determines that the highest potential side detection line L1 is broken (step S7). Further, the control section 2 confirms that the voltage C4v of the lowest potential side battery cell C4 is not 0 (step S8: NO).

On the other hand, for example, as shown in FIG. 5A and row (c) of FIG. 6, when the lowest potential side detection line L5 of the battery pack M is broken and the voltage of each of the battery cells C1, C2, C3, and C4 is 3.5 V, the voltage C4v of the lowest potential side battery cell C4 is detected as 0 V by the battery cell voltage detection section 3. All of the voltages C1v, C2v and C3v of the other battery cells C1, C2, and C3 are detected as 3.5 V by the battery cell voltage detection section 3 through the detection lines L1 to L4.

Further, the sum Csv of the voltages C1v, C2v, C3v, and C4v of the battery cells C1, C2, C3, and C4 is calculated to be 10.5 V by the control section 2. The voltage Mv of the battery pack M is detected by the battery pack voltage detection section 4 through the highest potential side detection line L1 which is not broken, the detection line L4 which is adjacent to the broken detection line L5, and the diode D4 which is positioned near a line breakage point. At this time, because a voltage drop value of the diode D4 is 0.7 V, the voltage Mv is calculated as follows: 10.5 V−0.7 V=9.8 V. Further, the difference ΔV between the sum Csv (=10.5 V) and the voltage Mv (=9.8 V) of the battery pack M is calculated to be 0.7 V by the control section 2. The difference ΔV of 0.7 V corresponds to the voltage drop value of the diode D4.

Accordingly, the control section 2 confirms that the difference ΔV is not 0 in step S4 of FIG. 7 (step S4: YES), and thereby determines that one of the highest potential side detection line L1 and the lowest potential side detection line L5 is broken (step S5). Then, the control section 2 confirms that the voltage C1v of the highest potential side battery cell C1 is not 0 (step S6: NO). Further, the control section 2 confirms that the voltage C4v of the lowest potential side battery cell C4 is 0 (step S8: YES), and thereby determines that the lowest potential side detection line L5 is broken (step S9).

On the other hand, for example, as shown in FIG. 5B and row (d) of FIG. 6, when both of the highest potential side detection line L1 and the lowest potential side detection line L5 of the battery pack M are broken and the voltage of each of the battery cells C1, C2, C3, and C4 is 3.5 V, each of the voltage C1v of the highest potential side battery cell C1 and the voltage C4v of the lowest potential side battery cell C4 is detected as 0 V by the battery cell voltage detection section 3. The voltages C2v and C3v of the other battery cells C2 and C3 are detected as 3.5 V by the battery cell voltage detection section 3 through the detection lines L2 to L4.

Further, the sum Csv of the voltages C1v, C2v, C3v, and C4v of the battery cells C1, C2, C3, and C4 is calculated to be 7 V by the control section 2. The voltage Mv of the battery pack M is detected by the battery pack voltage detection section 4 through the detection lines L2 and L4, which are respectively adjacent to the broken detection lines L1 and L5, and the diodes D1 and D4 which are positioned near respective line breakage points. At this time, because a sum of the voltage drop values of the diodes D1 and D4 is 1.4 V, the voltage Mv is calculated as follows: 7 V−1.4 V=5.6 V. Further, the difference ΔV between the sum Csv and the voltage Mv of the battery pack M is calculated to be 1.4 V by the control section 2. The difference ΔV of 1.4 V corresponds to the sum of the voltage drop values of the diodes D1 and D4.

Accordingly, the control section 2 confirms that the difference ΔV is not 0 in step S4 of FIG. 7 (step S4: YES), and thereby determines that one of the highest potential side detection line L1 and the lowest potential side detection line L5 is broken (step S5). Then, the control section 2 confirms that the voltage C1v of the highest potential side battery cell C1 is 0 (step S6: YES), and thereby determines that the highest potential side detection line L1 is broken (step S7). Further, the control section 2 confirms that the voltage C4v of the lowest potential side battery cell C4 is 0 (step S8: YES), and thereby determines that the lowest potential side detection line L5 is broken (step S9).

According to one or more embodiments of the present invention as described above, when the highest potential side detection line L1 or the lowest potential side detection line L5 is broken, the voltage C1v of the highest potential side battery cell C1 connected to the detection line L1 or the voltage C4v of the lowest potential side battery cell C4 connected to the detection line L5 is detected as 0 V by the battery cell voltage detection section 3. Further, the voltage Mv of the battery pack M is detected by the battery pack voltage detection section 4 through the highest potential side detection line L1 or the lowest potential side detection line L5, which is not broken, the detection line L2 or the detection line L4, which is adjacent to the broken detection line, and the diode D1 or the diode D4, which is positioned near a line breakage point. That is, a value obtained by subtracting the voltage drop value of the diode D1 or the diode D4, which is positioned near the line breakage point, from the sum of the voltages of the serially connected battery cells other than the highest potential side battery cell or the lowest potential side battery cell, which is connected to the broken one of the highest potential side detection line L1 and the lowest potential side detection line L5 is detected as the voltage Mv of the battery pack M.

Therefore, the sum Csv of the voltages C1v to C4v of the battery cells C1 to C4 detected by the battery cell voltage detection section 3, and the voltage Mv of the battery pack M detected by the battery pack voltage detection section 4 are not equal to each other. Accordingly, it is determined by the control section 2 that one of the highest potential side detection line L1 and the lowest potential side detection line L5 is broken. Therefore, it is possible to easily detect line breakage of the detection lines L1 and L5 on the highest potential side and the lowest potential side of the battery pack M by the use of the voltage drop of the diode D1 and the diode D4.

Further, in one or more embodiments of the present invention as described above, it is determined that the highest potential side detection line L1 is broken by confirming that the voltage C1v of the highest potential side battery cell C1 is 0 V. Further, it is determined that the lowest potential side detection line L5 is broken by confirming that the voltage C4v of the lowest potential side battery cell C4 is 0 V. Therefore, it is possible to individually detect each of the line breakage of the highest potential side detection line L1 and the line breakage of the lowest potential side detection line L5 of the battery pack M.

Next, a line breakage detection process according to one or more embodiments of the present invention will be described with reference to FIG. 8. This line breakage detection process is also a process for detecting line breakage of the detection lines L1 and L5, which are connected to respective ends of the battery pack M. FIGS. 4A to 6 are appropriately referenced to in the following description.

Figure 8:
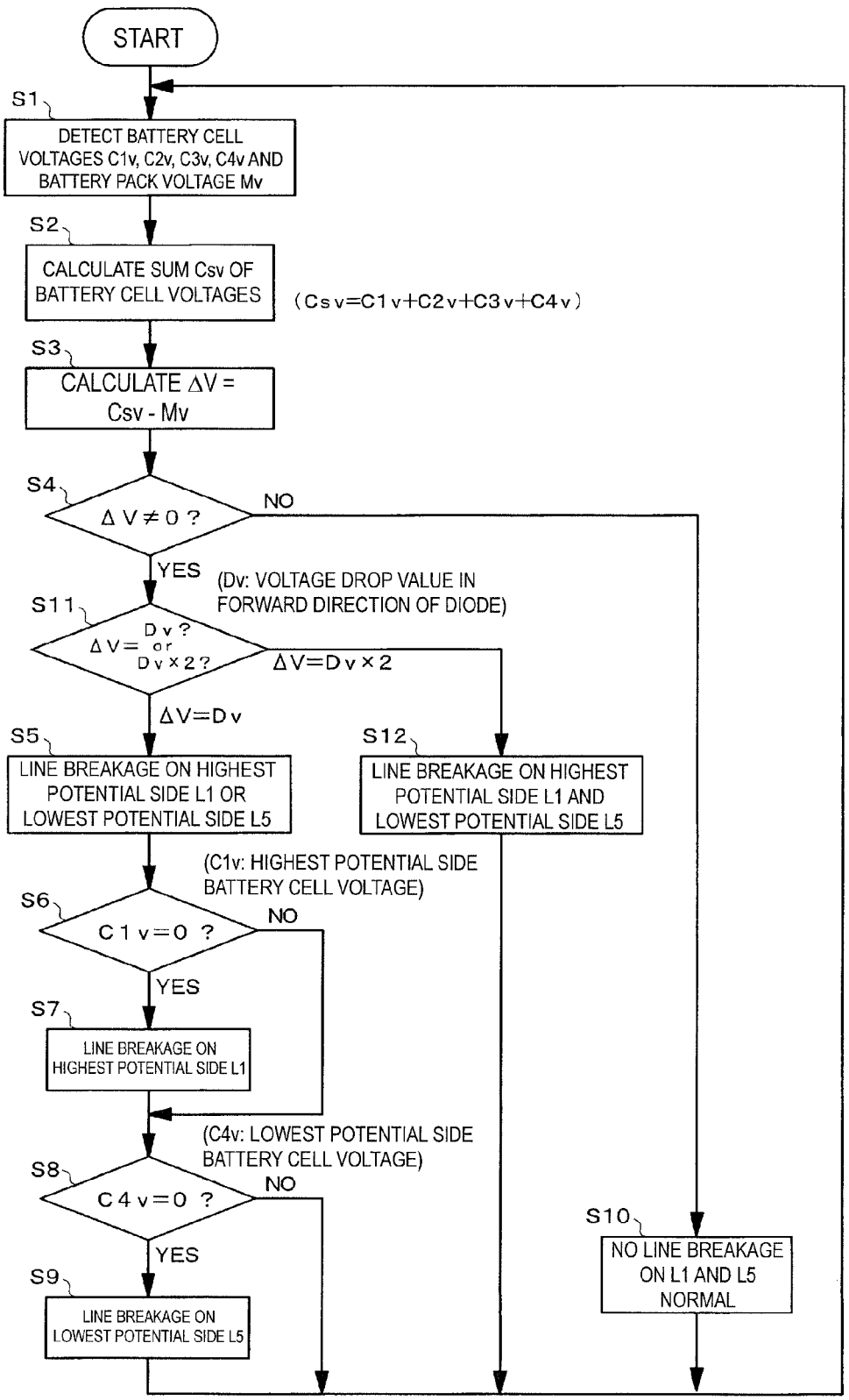
FIG. 8 is a flow chart illustrating a line breakage detection process according to one or more embodiments of the present invention.

In FIG. 8, steps in which the same processes as those in FIG. 7 are carried out are denoted by the same reference numerals as those in FIG. 7. Firstly, voltages C1v, C2v, C3v, and C4v of the battery cells C1, C2, C3, and C4 are detected by the battery cell voltage detection section 3 of the battery pack monitoring apparatus 1, and a voltage Mv of the battery pack M is detected by the battery pack voltage detection section 4 of the battery pack monitoring apparatus 1 (step S1). Next, the control section 2 calculates a sum Csv of the voltages C1v, C2v, C3v, and C4v of the battery cells C1, C2, C3, and C4 (step S2) and then calculates a difference ΔV between the sum Csv and the voltage Mv of the battery pack M (step S3).

Then, in a case where the control section 2 confirms that the difference ΔV is not 0 (step S4: YES), the control section 2 confirms whether the difference ΔV is equal to a voltage drop value Dv of the diode D1 or the diode D4, or whether the difference ΔV is equal to twice the voltage drop value Dv (Dv×2) (step S11).

Both of the voltage drop value Dv of the diode D1 and the voltage drop value Dv of the diode D4 are 0.7 V. Therefore, a value twice the voltage drop value Dv (Dv×2) is 1.4 V which is the same as a value obtained by adding the voltage drop value Dv of the diode D1 and the voltage drop value Dv of the diode D4.

At this time, as shown in FIG. 4B and the row (b) of FIG. 6, when only the highest potential side detection line L1 is broken, the difference ΔV becomes 0.7 V, which means that the difference ΔV is equal to the voltage drop value Dv of each of the diodes D1 and D4. Therefore, the control section 2 confirms that the difference ΔV is equal to the voltage drop value Dv of each of the diodes D1 and D4 in step S11 of FIG. 8 (step S11: ΔV=Dv), and thereby determines that one of the highest potential side detection line L1 and the lowest potential side detection line L5 is broken (step S5).

Thereafter, in a case where the voltage C1v of the highest potential side battery cell C1 is 0 (step S6: YES), the control section 2 determines that the highest potential side detection line L1 is broken (step S7). Further, in a case where the voltage C4v of the lowest potential side battery cell C4 is 0 (step S8: YES), the control section 2 determines that the lowest potential side detection line L5 is broken (step S9).

On the other hand, as shown in FIG. 5B and the row (d) of FIG. 6, when both of the highest potential side detection line L1 and the lowest potential side detection line L5 are broken, the difference ΔV becomes 1.4 V, which means that the difference ΔV is equal to twice the voltage drop value Dv of each of the diodes D1 and D4. Therefore, the control section 2 confirms that the difference ΔV is equal to twice the voltage drop value Dv of each of the diodes D1 and D4 in step S11 of FIG. 8 (step S11: ΔV=Dv×2), and thereby determines that both of the highest potential side detection line L1 and the lowest potential side detection line L5 are broken (step S12).

According to one or more embodiments of the present invention as described above, when the difference ΔV between the sum Csv of the voltages C1v to C4v of the battery cells C1 to C4 and the voltage Mv of the battery pack M is equal to the voltage drop value Dv of each of the diodes D1 and D4, it is possible to detect line breakage of the highest potential side detection line L1 or the lowest potential side detection line L5. Further, when the difference ΔV is equal to twice the voltage drop value Dv of each of the diodes D1 and D4, it is possible to detect line breakage of both of the highest potential side detection line L1 and the lowest potential side detection line L5.

The present invention can employ various embodiments other than the embodiments described above. For example, although there has been described an example in which the battery pack monitoring apparatus 1 detects line breakage of the detection lines on the highest potential side and the lowest potential side of the battery pack M constituted of the four battery cells C1 to C4 connected in series in one or more embodiments of the present invention as described above, the present invention is not limited thereto. In addition, it is possible to apply the battery pack monitoring apparatus 1 also to a battery pack constituted of two, three, or five or more battery cells connected in series to thereby detect line breakage of detection lines on the highest potential side and the lowest potential side of the battery pack.

Further, although there has been described an example in which the voltage drop value Dv of the diode D1 connected in parallel to the highest potential side battery cell C1 and the voltage drop value Dv of the diode D4 connected in parallel to the lowest potential side battery cell C4 are equal to each other in one or more embodiments of the present invention as described above, the present invention is not limited thereto. That is, the voltage drop values of the diodes D1 and D4 may be different from each other. When the voltage drop values of the diodes D1 and D4 are different from each other, it is confirmed whether the difference ΔV between the sum Csv of the voltages C1v, C2v, C3v, and C4v of the battery cells C1, C2, C3, and C4 and the voltage Mv of the battery pack M is equal to the voltage drop value of either the diode D1 or the diode D4, or whether the difference ΔV is equal to the sum of the voltage drop values of the diodes D1 and D4. Then, based on the thus confirmed result, it is determined as to whether line breakage is present on the highest potential side detection line L1, on the lowest potential side detection line L5, or on both of the detection lines L1 and L5.

Further, although there has been described an example in which the present invention is applied to the battery pack monitoring apparatus 1 used in a charge/discharge control system for a battery pack that is mounted on an electric vehicle in one or more embodiments of the present invention as described above, the present invention can also be applied to a battery pack monitoring apparatus that is used for any purpose other than the above.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A battery pack monitoring apparatus comprising:
a battery cell voltage detection section for detecting a voltage of each of serially connected battery cells constituting a battery pack through detection lines connected to both electrodes of each of the battery cells;
a battery pack voltage detection section for detecting a voltage of the battery pack through the detection line on a highest potential side of the battery pack and the detection line on a lowest potential side of the battery pack;
diodes each being connected in parallel to the battery cell on the highest potential side of the battery pack and the battery cell on the lowest potential side of the battery pack in a forward direction from a negative electrode toward a positive electrode of each of the battery cells; and
a line breakage determining section for determining that one of the detection line on the highest potential side and the detection line on the lowest potential side is broken when a sum of the voltage of each of the battery cells detected by the battery cell voltage detection section and the voltage of the battery pack detected by the battery pack voltage detection section are not equal to each other.

2. The battery pack monitoring apparatus according to claim 1,
wherein the line breakage determining section determines that the detection line on the highest potential side is broken when a voltage of the battery cell on the highest potential side is 0 V, and
wherein the line breakage determining section determines that the detection line on the lowest potential side is broken when a voltage of the battery cell on the lowest potential side is 0 V.

3. The battery pack monitoring apparatus according to claim 1,
wherein the line breakage determining section determines that one of the detection line on the highest potential side and the detection line on the lowest potential side is broken when a difference between the sum of the voltage of each of the battery cells and the voltage of the battery pack is equal to a voltage drop value in a forward direction of each of the diodes, and
wherein the line breakage determining section determines that both of the detection line on the highest potential side and the detection line on the lowest potential side are broken when the difference between the sum of the voltage of each of the battery cells and the voltage of the battery pack is equal to twice the voltage drop value in the forward direction of each of the diodes.

4. The battery pack monitoring apparatus according to claim 2,
wherein the line breakage determining section determines that one of the detection line on the highest potential side and the detection line on the lowest potential side is broken when a difference between the sum of the voltage of each of the battery cells and the voltage of the battery pack is equal to a voltage drop value in a forward direction of each of the diodes, and
wherein the line breakage determining section determines that both of the detection line on the highest potential side and the detection line on the lowest potential side are broken when the difference between the sum of the voltage of each of the battery cells and the voltage of the battery pack is equal to twice the voltage drop value in the forward direction of each of the diodes.

\* \* \* \* \*